United States Patent
Odnoblyudov et al.

(10) Patent No.: US 10,170,668 B2
(45) Date of Patent: Jan. 1, 2019

(54) SOLID STATE LIGHTING DEVICES WITH IMPROVED CURRENT SPREADING AND LIGHT EXTRACTION AND ASSOCIATED METHODS

(75) Inventors: Vladimir Odnoblyudov, Eagle, ID (US); Martin F. Schubert, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 527 days.

(21) Appl. No.: 13/165,248

(22) Filed: Jun. 21, 2011

(65) Prior Publication Data
US 2012/0326187 A1    Dec. 27, 2012

(51) Int. Cl.
*H01L 33/60*    (2010.01)
*H01L 33/38*    (2010.01)
*H01L 33/44*    (2010.01)

(52) U.S. Cl.
CPC ............ *H01L 33/382* (2013.01); *H01L 33/44* (2013.01)

(58) Field of Classification Search
CPC .............................. H01L 33/44; H01L 33/382
USPC .......................................................... 257/98
See application file for complete search history.

(56) References Cited

U.S. PATENT DOCUMENTS

| | | | |
|---|---|---|---|
| 6,821,804 B2 | 11/2004 | Thibeault et al. | |
| 6,844,571 B2 | 1/2005 | Krames et al. | |
| 7,456,435 B2 | 11/2008 | Aoyagi et al. | |
| 7,534,633 B2 | 5/2009 | Batres et al. | |
| 2006/0124943 A1 | 6/2006 | Li et al. | |
| 2007/0085093 A1* | 4/2007 | Ohmae | C30B 23/04 257/89 |
| 2007/0295981 A1* | 12/2007 | Erchak | H01L 33/20 257/98 |
| 2008/0230792 A1 | 9/2008 | Jiang et al. | |
| 2010/0025719 A1 | 2/2010 | Li | |
| 2010/0140637 A1 | 6/2010 | Donofrio et al. | |
| 2010/0148185 A1* | 6/2010 | Hsu | 257/76 |

* cited by examiner

*Primary Examiner* — Ori Nadav
(74) *Attorney, Agent, or Firm* — Perkins Coie LLP

(57) ABSTRACT

Solid state lighting ("SSL") devices with improved current spreading and light extraction and associated methods are disclosed herein. In one embodiment, an SSL device includes a solid state emitter ("SSE") that has a first semiconductor material, a second semiconductor material spaced apart from the first semiconductor material, and an active region between the first and second semiconductor materials. The SSL device can further include a first contact on the first semiconductor material and a second contact on the second semiconductor material and opposite the first contact. The second contact can include one ore more interconnected fingers. Additionally, the SSL device can include an insulative feature extending from the first contact at least partially into the first semiconductor material. The insulative feature can be substantially aligned with the second contact.

11 Claims, 10 Drawing Sheets

SOLID STATE LIGHTING DEVICES WITH IMPROVED CURRENT SPREADING AND LIGHT EXTRACTION AND ASSOCIATED METHODS

TECHNICAL FIELD

The disclosed embodiments relate to solid state lighting ("SSL") devices and methods of manufacturing SSL devices. In particular, the disclosed embodiments are related to SSL devices with improved current spreading and light extraction, and associated methods of use and manufacture.

BACKGROUND

Mobile phones, personal digital assistants ("PDAs"), digital cameras, MP3 players, and other portable electronic devices utilize SSL devices (e.g., light emitting diodes ("LEDs")) for background illumination. SSL devices are also used for signage, indoor lighting, outdoor lighting, and other types of general illumination. FIGS. 1A and 1B are cross-sectional and plan views, respectively, of a conventional SSL device 10 including an LED structure 11 having N-type gallium nitride (GaN) 14, GaN/indium gallium nitride (InGaN) multiple quantum wells ("MQWs") 16, and P-type GaN 18. The SSL device 10 also includes a first contact 20 at the P-type GaN 18 and a second contact 22 at the N-type GaN 14. The first contact 20 includes a sheet-like structure across the underside of the P-type GaN 18. The second contact 22 includes a plurality of fingers 21 (three are shown for illustration purposes) coupled to one another by a cross member 23 (FIG. 1B). In operation, a continuous or pulsed electrical voltage is applied between the first and second contacts 20 and 22. In response, as electrical current flows from the second contact 22, through the N-type GaN 14, the GaN/InGaN MQWs 16, and the P-type GaN 18 to the first contact 22, the GaN/InGaN MQWs 16 convert a portion of the electrical energy into light. The generated light is extracted from the N-type GaN 14 of the SSL device 10 for illumination and/or other suitable purposes.

SSL devices having contact structures on the front and back surface of the LED structure 11, such as the fingers 21 and the first contact 20 shown in FIGS. 1A and 1B, are known to those skilled in the art as "thin-film" SSL devices. Such thin-film SSL devices have high thermal performance and efficiency. The fingers 21, however, may be opaque and thus block some of the light. For example, according to conventional techniques, the first and second contacts 20 and 22 typically include aluminum, copper, or other opaque conductive materials. As a result, the second contact 22 blocks light generated in areas directly beneath it. These same areas, however, have the highest current density across the SSL device 10 and thus produce the highest intensity of light in the SSL device 10. Consequently, regions with the highest light intensity per unit area also have the lowest probability of extracting light, which reduces light extraction efficiencies. Accordingly, several improvements in increasing current spreading and light extraction efficiency in SSL devices may be desirable.

DETAILED DESCRIPTION

Specific details of several embodiments of SSL devices with improved current spreading and light extraction and associated methods of using and manufacturing such SSL devices are described below. The term "SSL" generally refers to "solid state light" and/or "solid state lighting" according to the context in which it is used. The term solid state emitter ("SSE") generally refers to solid state light emitting dies that convert electrical energy into electromagnetic radiation in the visible, ultraviolet, infrared, and/or other spectra. SSEs include semiconductor light-emitting diodes ("LEDs"), polymer light-emitting diodes ("PLEDs"), organic light-emitting diodes ("OLEDs"), or other types of solid state devices that convert electrical energy into electromagnetic radiation in a desired spectrum. The term "light extraction efficiency" generally refers to a ratio of the amount of light extracted from an SSL device to the total light generated in the SSL device. A person skilled in the relevant art will also understand that the technology may have additional embodiments, and that the technology may be practiced without several of the details of the embodiments described below with reference to FIGS. 2A-8.

Figure 2A:
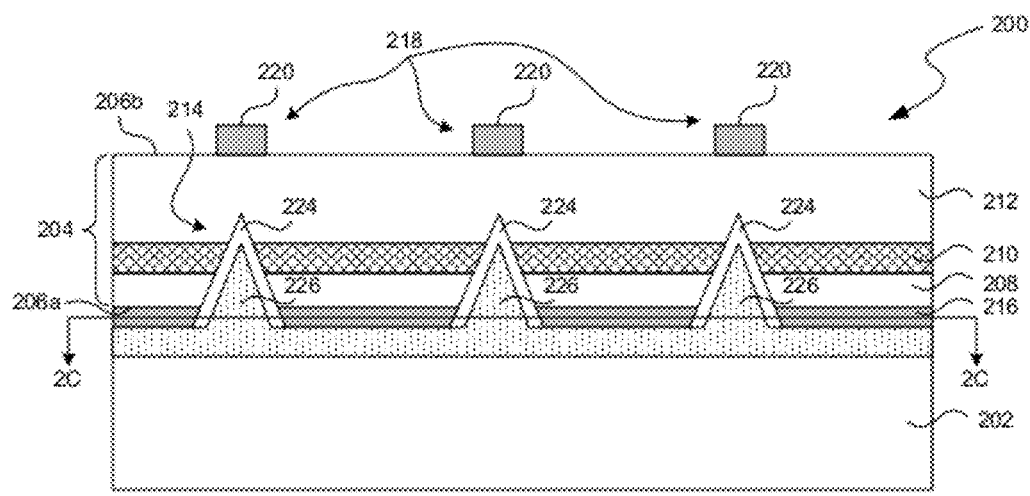
FIG. 2A is a schematic cross-sectional view of an SSL device in accordance with an embodiment of the present technology.
Figure 2B:
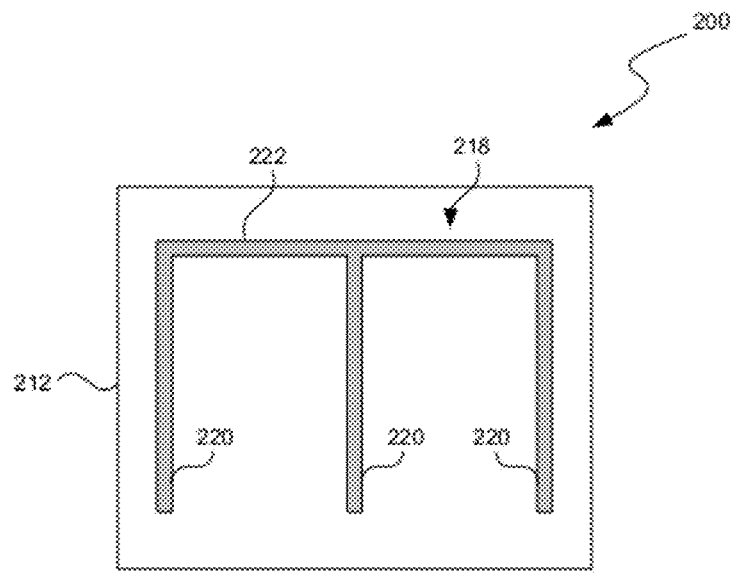
FIG. 2B is a schematic top plan view of the SSL device shown in FIG. 2A.
Figure 2C:
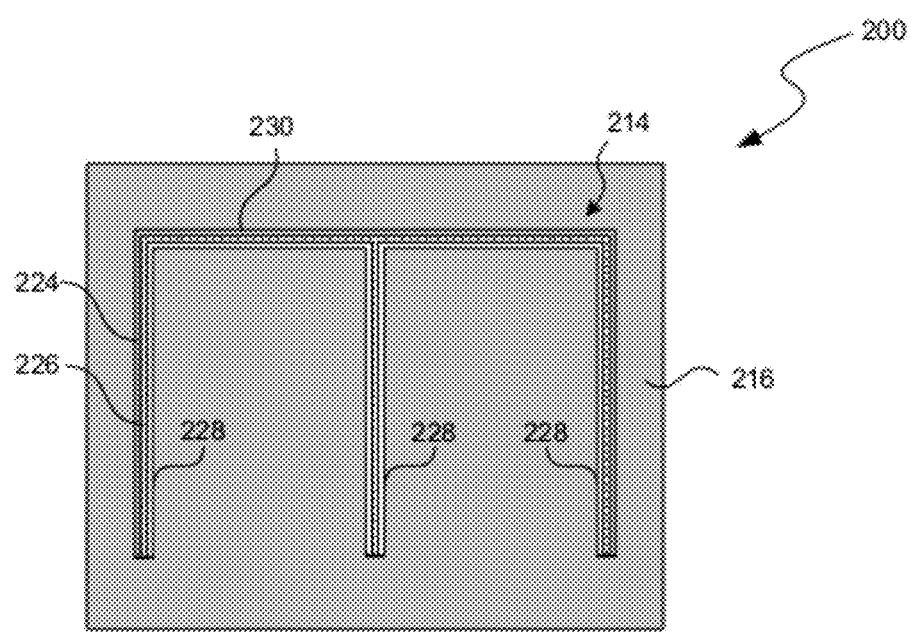
FIG. 2C is a schematic plan view of a portion of the SSL device taken substantially along line 2C-2C of FIG. 2A.

FIG. 2A is a schematic cross-sectional view of an SSL device 200 in accordance with an embodiment of the technology. FIG. 2B is a top plan view of the SSL device 200 of FIG. 2A, and FIG. 2C is a plan view of a portion of the SSL device 200 taken substantially along line 2C-2C of FIG. 2A. As shown in FIG. 2A, the SSL device 200 can include a support 202 and an SSE 204 attached to the support 202. The SSL device 200 can further include a first contact 216 at a first side 206a of the SSE 204 and a second contact 218 at a second side 206b of the SSE 204 opposite the first side 206a. Additionally, the SSL device 200 can include an insulative feature 214 at the first side of the SSE 204.

As shown in FIG. 2A, the SSE 204 can include a first semiconductor material 208, an active region 210, and a second semiconductor material 212. The first semiconductor material 208 can be a P-type semiconductor material proximate a first side 206a of the SSE 204, such as P-type gallium nitride ("P-GaN"). The second semiconductor material 212 can be an N-type semiconductor material proximate a second side 206b of the SSE 204, such as N-type gallium nitride ("N-GaN"). This configuration is suitable for SSEs 204 formed on opaque or translucent growth substrates and subsequently attached to the support 202. In selected embodiments, the first and second semiconductor materials 208 and 212 can individually include at least one of gallium arsenide (GaAs), aluminum gallium arsenide (AlGaAs), gallium arsenide phosphide (GaAsP), gallium (III) phosphide (GaP), zinc selenide (ZnSe), boron nitride (BN), aluminum gallium nitride (AlGaN), and/or other suitable semiconductor materials.

The active region 210 can include a single quantum well ("SQW"), MQWs, and/or a bulk semiconductor material. The term "bulk semiconductor material" generally refers to a single grain semiconductor material (e.g., InGaN) with a thickness between approximately 10 nanometers and approximately 500 nanometers. In certain embodiments, the active region 210 can include an InGaN SQW, GaN/InGaN MQWs, and/or an InGaN bulk material. In other embodiments, the active region 210 can include aluminum gallium indium phosphide (AlGaInP), aluminum gallium indium nitride (AlGaInN), and/or other suitable materials or configurations.

Figure 1A:
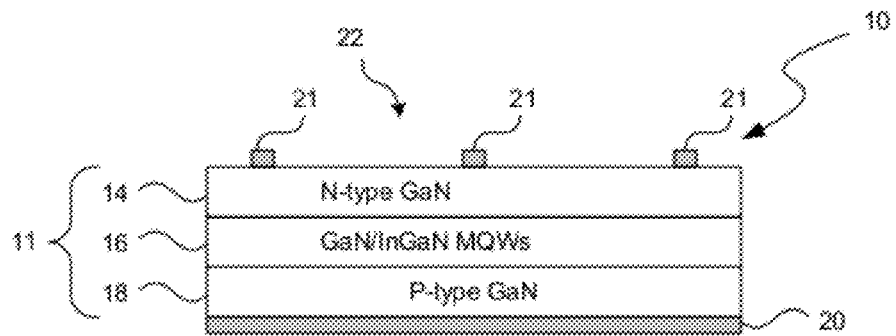
FIG. 1A is a schematic cross-sectional diagram of an SSL device in accordance with the prior art.
Figure 1B:
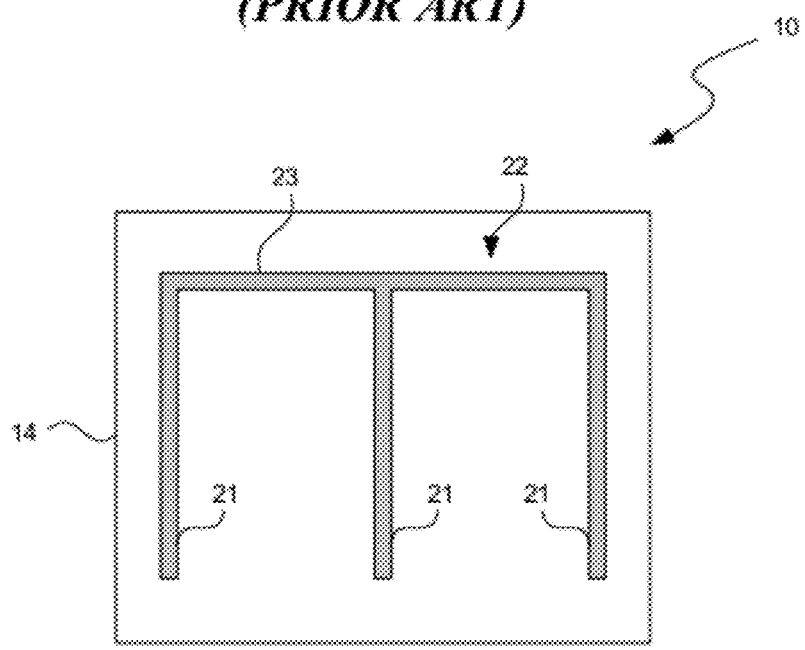
FIG. 1B is a schematic plan view of the SSL device in FIG. 1A.

As further shown in FIG. 2A, the first contact 216 can be electrically coupled to the first semiconductor material 208, and the second contact 218 can be electrically coupled to the second semiconductor material 212. The first contact 216 can be a layer of copper (Cu), aluminum (Al), tungsten (W), stainless steel, silver (Ag), nickel (Ni), and/or other suitable metal or metal alloy deposited on the first semiconductor material 208. The second contact 218 can have a structure generally similar to the first contact 20 shown in FIG. 1B. For example, as shown in FIG. 2B, the second contact 218 can include a plurality of fingers 220 connected to one another by a cross member 222. The fingers 220 and/or the cross member 222 can individually include an elongated structure as shown in FIG. 2B and/or other suitable structures. The fingers 220 and/or the cross member 222 can include copper (Cu), aluminum (Al), silver (Ag), gold (Au), platinum (Pt), and/or other suitable electrically conductive materials. In other embodiments, the second contact 218 can be a transparent electrode constructed from indium tin oxide ("ITO"), aluminum zinc oxide ("AZO"), fluorine-doped tine oxide ("FTO"), and/or other substantially transparent and conductive oxides.

The insulative feature 214 is configured to prevent ohmic contact at selected areas of the SSE 204. For example, as shown in FIG. 2A, portions of the insulative feature 214 can be substantially aligned (e.g., superimposed) with the fingers 220 to interrupt or block electrical current flowing directly between the first and second contacts 216 and 218. In the embodiment illustrated in FIG. 2C, for example, the insulative feature 214 includes three fingers 228 that correspond to the three fingers 220 of the second contact 218 (FIG. 2B) and a cross member 230 that corresponds to the cross member 222 of the second contact 218. In other embodiments, the insulative feature 214 can have other configurations that do not necessarily correspond to the size, number, or shape of the features of the second contact 218.

In the embodiment illustrated in FIG. 2A, the insulative feature 214 extends through the active region 210 and has a substantially equal width at the first side 206a of the SSE 204 as the width of the fingers 220 of the second contact 218. This configuration substantially eliminates the current density directly between the first and second contacts 216 and 218, and thereby substantially blocks light production under the second contact 218. In other embodiments, the insulative feature 214 can extend varying depths into the first semiconductor material 208, the active region 210, and/or the second semiconductor material 212 to vary the current density under the second contact 218. In further embodiments, the insulative feature 214 can have a width that is greater than or less than that of the corresponding portions of the second contact 218. In any of the foregoing embodiments, the protrusion of the insulative feature 214 into the SSE 204 and the width of the insulative feature 214 may be selected based on a target current flow profile in the SSL device 200.

The insulative feature 214 can include a dielectric material 224 to electrically insulate the first contact 216. The dielectric material 224 can be a substantially conformal layer as shown in FIG. 2A that includes silicon oxide, silicon nitride, magnesium oxide, and/or other suitable dielectric materials. In other embodiments, the dielectric material 224 can comprise a larger portion of the insulative feature 214. In further embodiments, the insulative feature 214 can include other electrically insulative materials and/or electrically insulative structures (e.g., air pockets).

As shown in FIG. 2A, the SSL device can further include a reflective material 226 that covers the backside of the first contact 216 and the insulative feature 214. When the insulative feature 214 is transparent (e.g., made of a transparent dielectric material 224), the reflective material 226 reflects and scatters light outboard of the second contact 218. The reflective material 226 can include gold (Au), copper (Cu), silver (Ag), aluminum (Al), and/or any other suitable material that reflects light emitted from the active region 210. The reflective material 226 can be selected based on its thermal conductivity and/or the color of light it reflects. For example, silver generally does not alter the color of the reflected light. Gold, copper, or other colored reflective materials can affect the color of the light and can accordingly be selected to produce a desired color for the light emitted by the SSL device 200. The insulative feature 214 and the reflective material 226 are configured to prevent light from being obstructed by the second contact 218 and further increase the light extraction efficiency of the SSL device 200.

When the reflective material 226 covers the backside of the first contact 216, the reflective layer 226 can provide additional adhesion between the first contact 216 and the first semiconductor material 208 to prevent electrical shorting and improve the reliability of the SSL device 200. This configuration can be especially advantageous when the first contact 216 is silver-based because it can increase the adhesion strength of the silver and prevent silver electromigration.

Several embodiments of the SSL device 200 shown in FIGS. 2A-2C can have enhanced current spreading and a higher light extraction efficiency than conventional SSL devices. As explained above with reference to FIGS. 1A and 1B, conventional SSL devices are inefficient because, among other reasons, the highest current density in conventional SSL devices is directly under the second contacts. The SSL device 200 avoids this problem because the insulative feature 214 shown in FIGS. 2A and 2C reduces or eliminates the current density directly under the second contact 218. This spreads the current into the non-contact areas that are not blocked by the second contact 218 and causes the non-contact areas to have higher current densities than without the insulative feature 214. The SSL device 200, therefore, has a high extraction efficiency because more light is generated from the non-contact areas where the light can be readily extracted without being blocked by the second contact 218. Additionally, the insulative feature 214 and the reflective material 226 shown in FIGS. 2A and 2C can scatter light and further increase the light extraction efficiency of the SSL device 200.

Figure 3A:
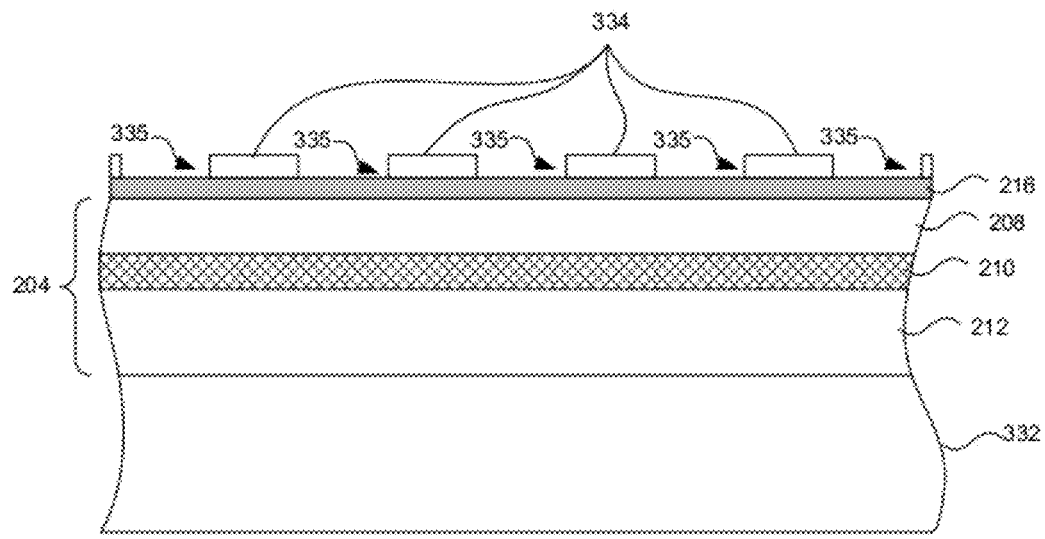
FIGS. 3A-3E are schematic cross-sectional views of a method of fabricating SSL devices in accordance with embodiments of the present technology.

FIGS. 3A-3E illustrate a process of forming the SSL device 200 in accordance with an embodiment of the present technology. FIG. 3A shows a stage of the process after the SSE 204 has been formed on a formation substrate 332. The SSE 204 can be formed via metal organic chemical vapor deposition ("MOCVD"), molecular beam epitaxy ("MBE"), liquid phase epitaxy ("LPE"), and/or hydride vapor phase epitaxy ("HVPE"). In other embodiments, at least one of the first semiconductor material 208, the active region 210, and the second semiconductor material 212 may be formed via other suitable epitaxial growth techniques. Additionally, as shown in FIG. 3A, the first contact 216 can be formed over the first semiconductor material 208 using chemical vapor deposition ("CVD"), physical vapor deposition ("PVD"), atomic layer deposition ("ALD"), or other techniques known in the semiconductor fabrication arts. A masking material 334 (e.g., a photoresist) can be deposited and processed to have a desired pattern of openings 335 over the first contact 216.

Figure 3B:
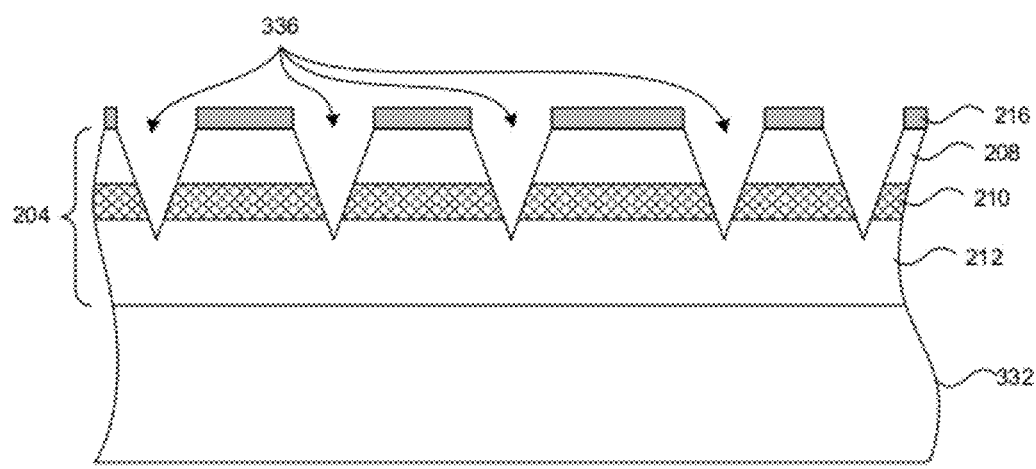

FIG. 3B illustrates a stage of the process after etching one or more trenches 336 through the first contact 216 and into at least a portion of the SSE 204. In the embodiment shown in FIG. 3B, for example, the trenches 336 extend through the junction between the first and second semiconductor materials 208 and 212. In other embodiments, the trenches 336 can extend deeper or shallower into the SSE 204 and/or be formed using other suitable semiconductor fabrication techniques. The trenches 336 can be V-shaped as shown in FIG. 3B, and/or they can have other suitable shapes. In selected embodiments, the shapes, positions, and dimensions of the trenches 336 are based on the desired shape, position, and dimension of the subsequently formed second contact 218 (FIG. 3E). For example, the trenches 336 can be configured such that they define the configuration of the fingers 228 and the cross member 230 described above with reference to FIGS. 2A-2C. After forming the trenches 336, the masking material 334 is removed from the remaining portions of the first contact 216.

Figure 3C:
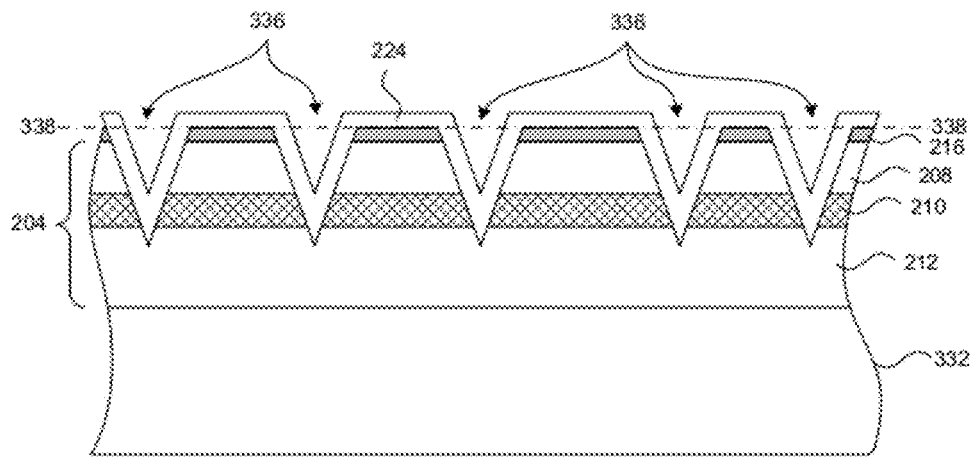

FIG. 3C shows a stage of the process after depositing the dielectric material 224 into the trenches 336 and over the remaining portions of the first contact 216. The dielectric material 224 can be deposited using CVD, ALD, spin coating, or other suitable deposition methods. The dielectric material 224 can be a conformal layer as shown in FIG. 3C. In other embodiments, the dielectric material 224 can be deposited such that it substantially fills the trenches 336. The overburden of the dielectric material 224 that covers the first contact 216 (e.g., line 338) can be removed using dry etching, wet etching, laser ablation, and/or other suitable material removal techniques.

Figure 3D:
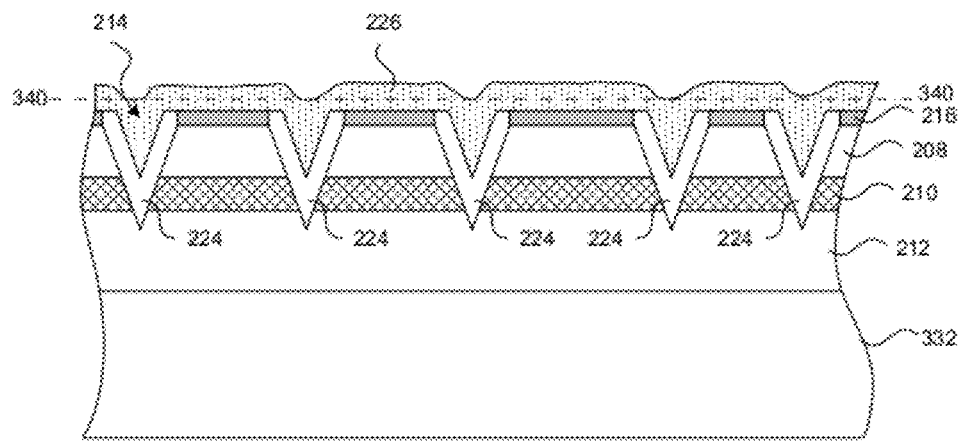
Figure 3E:
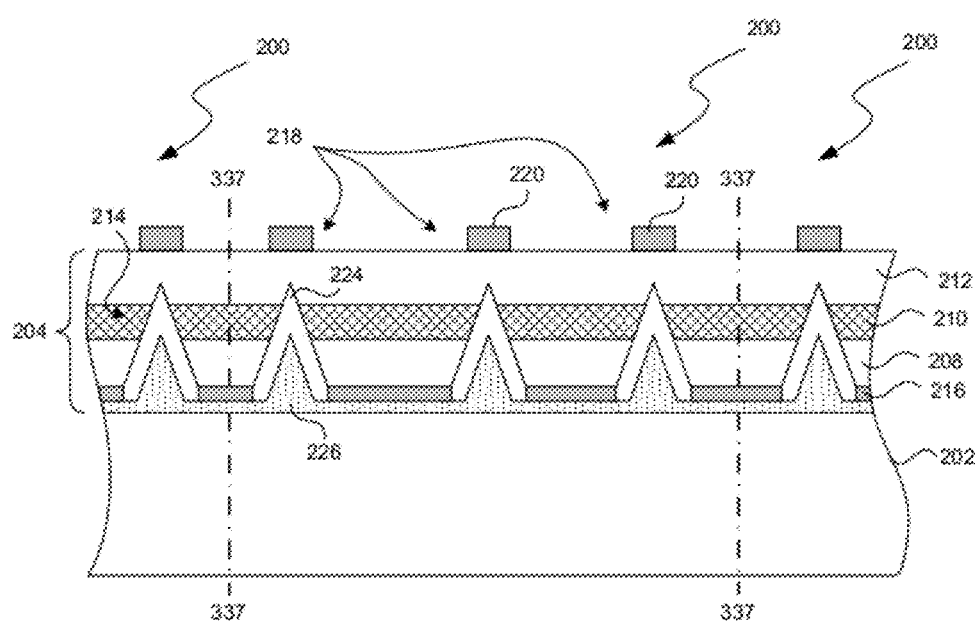

FIG. 3D illustrates a stage of the process after the reflective material 226 has been deposited over the dielectric material 224 and the first contact 216. The reflective material 226 can be deposited using CVD, ALD, plating, and/or other suitable semiconductor fabrication techniques. A portion of the reflective material 226 can be removed (e.g., along line 340) using dry etching, wet etching, laser ablation, grinding, planarizing, and/or other suitable material removal techniques. In the embodiment shown in FIG. 3D, a portion of the reflective material 226 remains on the first contact 216 such that the reflective material 226 effectively encapsulates the first contact 216 to strengthen the bond between the first contact 216 and the first semiconductor material 208.

FIG. 3E illustrates a stage of the process after the formation substrate 332 has been removed from the second semiconductor material 212 and the reflective material 226 has been attached to the support 202 via a bonding process (not shown). The process can further include forming the second contact 218 on the second semiconductor material 212. As shown in FIG. 3E, the second contact 218 can correspond to the insulative feature 214 such that the current density under the second contact 218 is substantially reduced or eliminated. Optionally, as shown in FIG. 3E, the process can also include singulating individual SSL devices 200 along lines 337-337. The process may also optionally include surface roughening for increased light extraction.

Figure 4A:
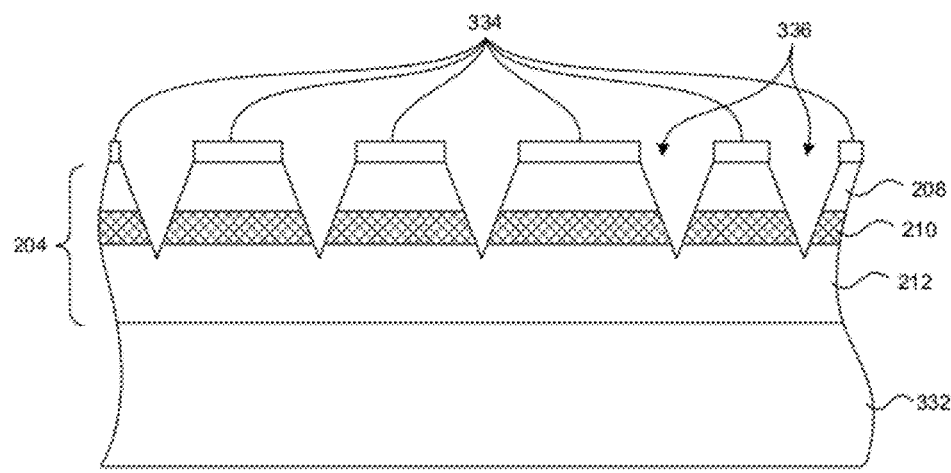
FIGS. 4A-4D are schematic cross-sectional views of a method of fabricating SSL devices in accordance with another embodiment of the present technology.

FIGS. 4A-4D illustrate a process of forming an SSL device 400 in accordance with another embodiment of the present technology. The process can include generally similar steps as the process described above with reference to FIGS. 3A-3E. For example, FIG. 4A shows a stage of the process after the trenches 336 have been formed in the SSE 204. FIG. 4A is similar to FIGS. 3A and 3B, but in FIG. 4A the trenches 336 are formed before depositing a conductive material for the first contact 216 onto the first semiconductor material 208. In the embodiment shown in FIG. 4A, the masking material 334 (e.g., a photoresist) is accordingly formed on the first semiconductor material 208 in a desired configuration such that portions of the SSE 204 can be removed to form the trenches 336.

Figure 4B:
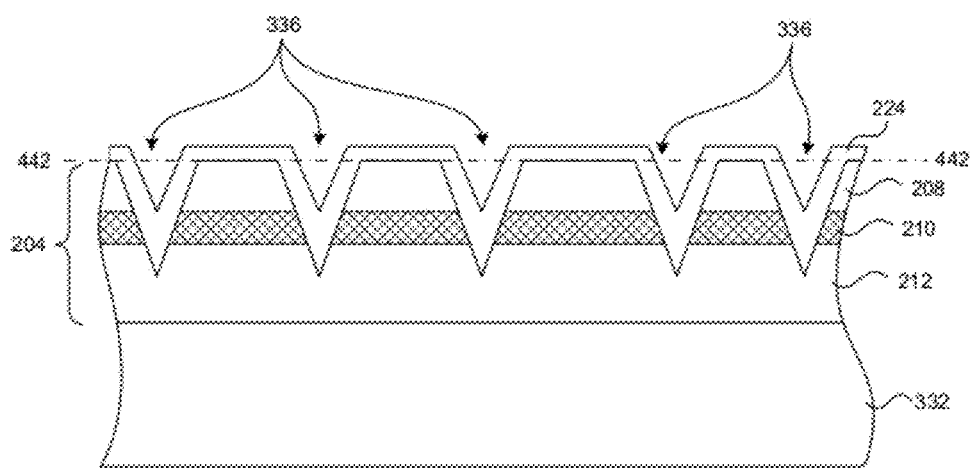
Figure 4C:
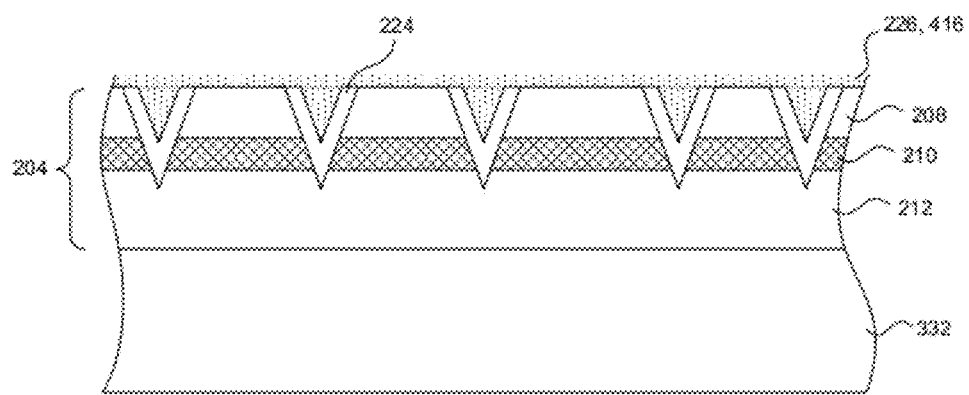

As shown in FIGS. 4B and 4C, the process can further include forming the dielectric material 224 in the trenches 336 (FIG. 4B) and depositing the reflective material 226 over the dielectric material 224 (FIG. 4C). Referring to FIG. 4B, the overburden of the dielectric material 224 can be removed along line 442 to expose the portions of the first semiconductor material 208 under the dielectric material 224. Referring to FIG. 4C, the reflective material 226 can be conductive and electrically coupled to the first semiconductor material 208. The reflective material 226 can thus define a first contact 416. In this configuration, the reflective material 226 can also redirect light back through the first semiconductor material 208, the active region 210, and the second semiconductor material 212.

Figure 4D:
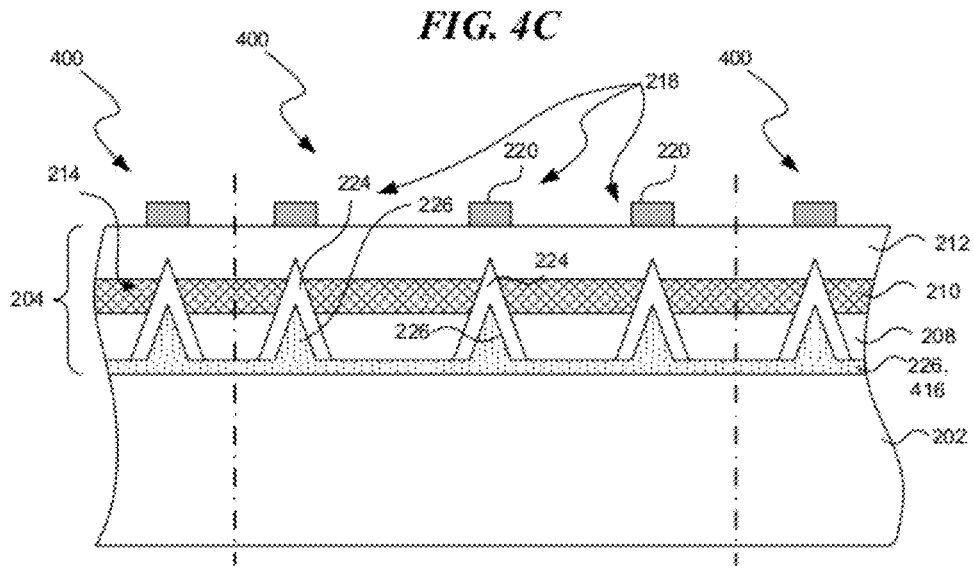

FIG. 4D shows a subsequent stage of the process after the SSE 204 has been removed from the formation substrate 332 and the reflective material 226 has been attached to the support 202. The second contact 218 can then be formed on the second semiconductor material 212 such that it generally corresponds to at least a portion of the insulative feature 214. The insulative feature 214 can reduce or eliminate current from flowing directly under the second contact 218 and thereby increase the light extraction of the SSL devices 400 in a manner similar to the SSL devices 200 described above.

Figure 5:
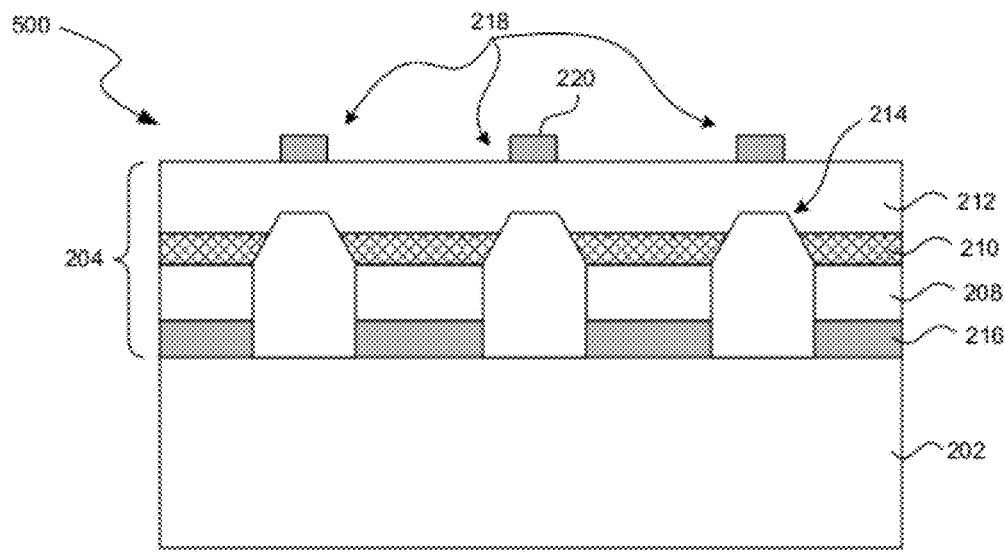
FIG. 5 is a schematic cross-sectional view of an SSL device in accordance with a further embodiment of the present technology.

FIG. 5 is a schematic cross-sectional view of an SSL device 500 in accordance with another embodiment of the present technology. Several features of the SSL device 500 are generally similar to the features of the SSL devices 200 and 400 described above with reference to FIGS. 2A-4D. For example, the SSL device 500 includes the support 202, the SSE 204, and the first and second contacts 216 and 218 spaced vertically apart from one another. Additionally, as shown in FIG. 5, the SSL device 500 includes the insulative feature 214 that is generally aligned with the second contact 218 to enhance the light extraction efficiency of the SSL device 500. However, rather than the insulative feature 214 including a dielectric material and/or a reflective material as described above, the insulative feature 214 illustrated in FIG. 5 includes one or more air-filled gaps that can spread the current in the SSE 204 and scatter light generated by the SSE 204. In other embodiments, the insulative feature 214 can include another suitable insulative gas. Additionally, as shown in FIG. 5, the insulative feature 214 can also have a different shape than the V-shape shown in FIGS. 2A-4D and different dimensions than the second contact 218.

Figure 6:
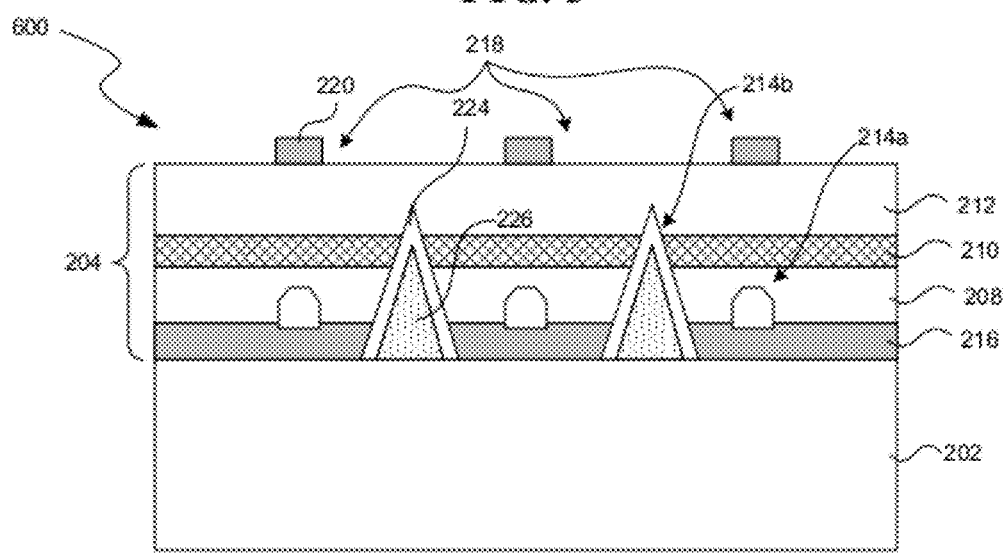
FIG. 6 is a schematic cross-sectional view of an SSL device in accordance with an additional embodiment of the present technology.

FIG. 6 is a schematic cross-sectional view of an SSL device 600 in accordance with an additional embodiment of the present technology. Several features of the SSL device 600 are generally similar to the features of the SSL devices 200, 400 and 500 described above with reference to FIGS. 2A-5. As shown in FIG. 6, the SSL device 600 can include a first insulative feature 214a and a second insulative feature 214b. Similar to the insulative feature 214 shown in FIG. 5, the first insulative feature 214a can include one or more air-filled gaps that are substantially aligned with the second contact 218 to spread current and scatter light from under the second contact 218. In the embodiment illustrated in FIG. 6, the first insulative feature 214a extends only partially into the first semiconductor material 208 and therefore reduces, rather than eliminates, the current density under the second contact 218. Additionally, as shown in FIG. 6, the first insulative feature 214a can also vary in width from the insulative features 214 shown in FIGS. 2A-5.

The second insulative feature 214b can be positioned at non-contact portions of the SSE 204. Similar to the insulative features 214 described above with reference to FIGS. 2A-4D, the second insulative feature 214b can include the dielectric material 224 that extends through the junction between the first and second semiconductor materials 208 and 212. The second insulative feature 214b can further control current spreading and scatter light.

Figure 7:
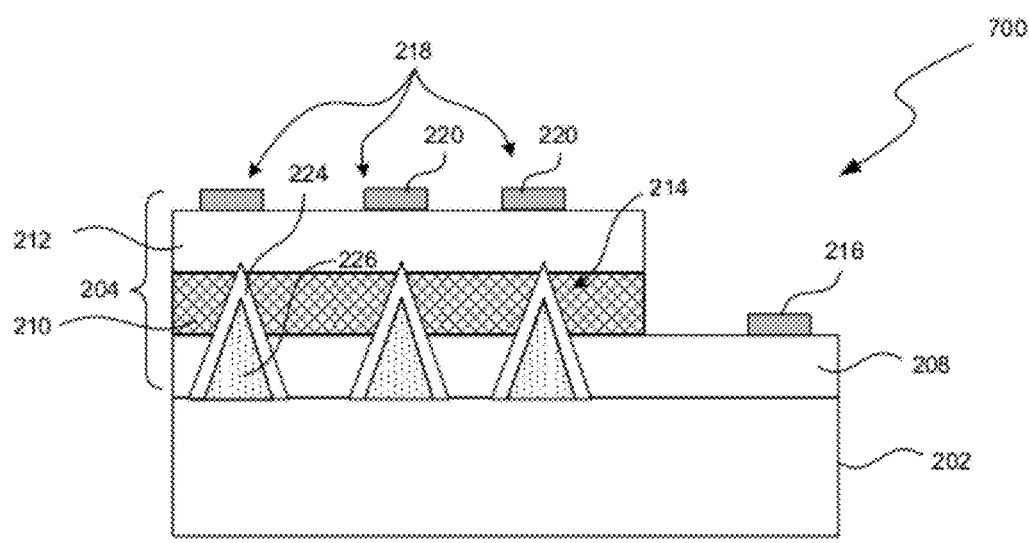
FIG. 7 is a schematic cross-sectional view of an SSL device in accordance with yet another embodiment of the present technology.

FIG. 7 is a schematic cross-sectional view of an SSL device 700 in accordance with yet another embodiment of the present technology. Several features of the SSL device 700 are generally similar to the features of the SSL devices 200, 400, 500 and 600 described above with reference to FIGS. 2A-6. However, rather than the first and second contacts 216 and 218 being spaced vertically apart from one another as described above, the first and second contacts 216 and 218 illustrated in FIG. 7 are spaced laterally apart from one another. Like the vertical SSL devices described above, the lateral SSL device 700 shown in FIG. 7 can also benefit from increased light extraction efficiencies provided by the insulative feature 214.

Figure 8:
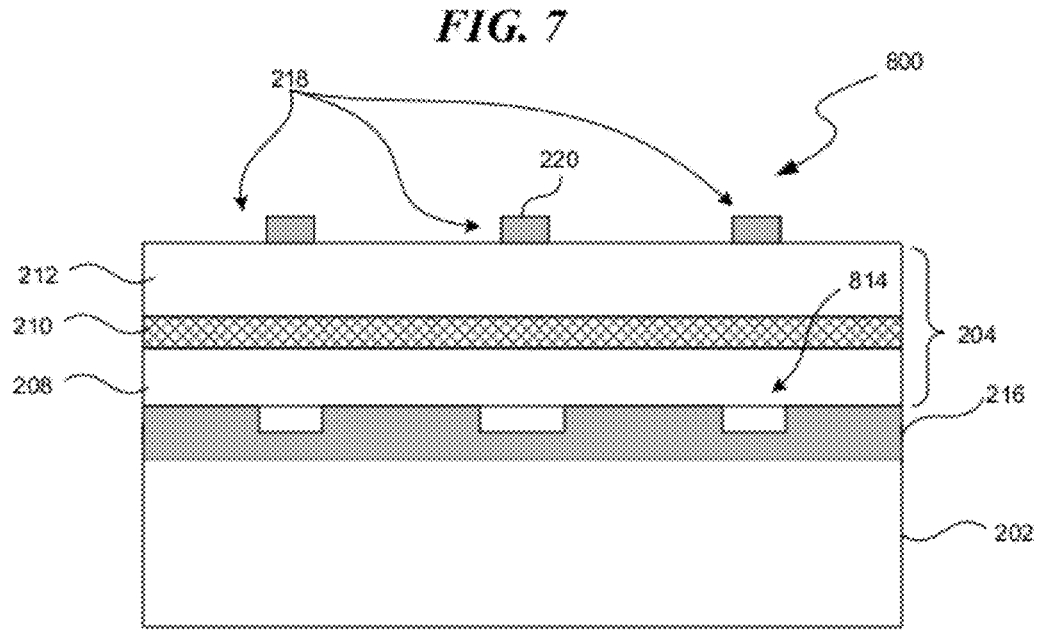
FIG. 8 is a schematic cross-sectional view of an SSL device in accordance with still another embodiment of the present technology.

FIG. 8 is a schematic cross-sectional view of an SSL device 800 configured in accordance with yet another embodiment of the present technology. Several features of the SSL device 800 are generally similar to the features of the SSL devices 200, 400, 500 and 600 described above with reference to FIGS. 2A-6. The SSL device 800 can include an insulative feature 814 positioned between portions of the first contact 216 and the first semiconductor material 208, rather than extending into the SSE 204 like the insulative features 214 described above. However, similar to the insulative features 214 described above, the insulative features 814 shown in FIG. 8 can be positioned where ohmic contact is not desirable (e.g., aligned with the second contact 218) to reduce the current density under the second contact 218. The insulative feature 814 shown in FIG. 8 can be filled with a dielectric material (e.g., the dielectric material 224 described above), an insulative gas (e.g., air), and/or other insulative material.

From the foregoing, it will be appreciated that specific embodiments of the technology have been described herein for purposes of illustration, but that various modifications may be made without deviating from the disclosure. For example, in FIGS. 2A-6 and 8, the first contact 216 is a blanket contact that covers the backside of the first semiconductor material 208. In other embodiments, the first contact 216 can be patterned such that it includes discrete portions and/or have other suitable contact configurations. Additionally, in any of the embodiments illustrated, the SSL devices can optionally include an optical component (e.g., a collimator, a lens) and/or other suitable components. Certain aspects of the new technology described in the context of particular embodiments may be combined or eliminated in other embodiments. For example, any of the SSL devices described above can include more than one insulative feature and/or portions of the insulative features can include different structures (e.g., air-filled gaps, dielectric material, etc.). Additionally, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A solid state lighting (SSL) device, comprising:
a solid state emitter (SSE) having a first semiconductor material, a second semiconductor material spaced apart from the first semiconductor material, and an active region between the first and second semiconductor materials, wherein the second semiconductor material has an emission surface;
a first contact on the first semiconductor material;
a second contact on the second semiconductor material and opposite to the first contact, the second contact having a plurality of interconnected conductive fingers; and
an insulative feature extending from the first contact at least partially into the first semiconductor material, the insulative feature having a plurality of interconnected insulative fingers, wherein the insulative feature comprises a transparent dielectric material having a backside;
the SSL device further comprises a reflective material at the backside of the transparent dielectric material;
each conductive finger is superimposed over a corresponding insulative fingers;
the SSE comprises non-contact areas outboard the area beneath the second contact; and
the insulative feature is configured to: (a) eliminate a direct current path orthogonal to the emission surface between the first and second contacts and (b) increase current spreading in the non-contact areas.

2. The SSL device of claim 1 wherein:
the second contact comprises a conductive cross member connecting the plurality of conductive fingers; and
the insulative feature comprises an insulative cross member connecting the plurality of insulative fingers, wherein the conductive cross member is superimposed over the insulative cross member.

3. The SSL device of claim 1 wherein the reflective material covers a backside of the dielectric material and the first contact.

4. The SSL device of claim 1 wherein the insulative feature extends at least to the second semiconductor material.

5. The SSL device of claim 1 wherein the insulative feature extends through the first semiconductor material and at least a portion of the active region.

6. The SSL device of claim 1 wherein a reflective material defines the first contact.

7. The SSL device of claim 1 wherein the insulative feature comprises a gas-filled gap.

8. The SSL device of claim 1 wherein:
the individual conductive fingers have a first width;
the individual insulative fingers have a second width; and
the second width is at least equal to the first width.

9. The SSL device of claim 1 wherein:
the second contact comprises a conductive cross member connecting the plurality of conductive fingers; and
the insulative feature comprises an insulative cross member connecting the plurality of insulative fingers, wherein the insulative cross member is aligned with the conductive cross member.

10. A solid state lighting (SSL) device, comprising:
a solid state emitter (SSE) having a first side and a second side opposite the first side;
a first contact at the first side;
a second contact at the second side, the second contact having a plurality of interconnected conductive fingers; and
an insulative feature at the first side of the SSE, the insulative feature having a plurality of interconnected insulative fingers, wherein the insulative feature is configured to increase current spreading in non-contact areas outboard of the second contact of the SSE, wherein the insulative feature comprises a transparent dielectric material having a backside;
the SSL comprises a reflective material at the backside of the transparent dielectric material;
the SSE comprises a first semiconductor material at the first side of the SSE, a second semiconductor material at the second side of the SSE, and an active region between the first and second semiconductor materials;
each conductive finger is superimposed over a corresponding insulative finger; and
the insulative feature extends at least to the second semiconductor material and is positioned to block a direct current path orthogonal to the second side between the first and second contacts and thereby reduce the current density under the plurality of interconnected conductive fingers.

11. The SSL device of claim 10 wherein the insulative feature comprises a gas-filled gap.

* * * * *